United States Patent [19]

Ozaki

[11] Patent Number: 4,942,577
[45] Date of Patent: Jul. 17, 1990

[54] LOGIC CIRCUIT SYSTEM WITH LATCH CIRCUITS FOR RELIABLE SCAN-PATH TESTING

[75] Inventor: Hideharu Ozaki, Tokyo, Japan

[73] Assignee: NEC Corporation, Tokyo, Japan

[21] Appl. No.: 184,315

[22] Filed: Apr. 21, 1988

[30] Foreign Application Priority Data

Apr. 21, 1987 [JP] Japan .................................. 62-98816

[51] Int. Cl.⁵ ............................................. G01R 31/28
[52] U.S. Cl. .................................... 371/22.3; 371/25.1
[58] Field of Search .................. 371/25, 15, 22.1, 22.3, 371/15.1, 22.4, 22.6, 22.5, 25.1; 307/272.1, 272.2, 602; 324/73 R; 377/73, 77, 54; 328/104, 105

[56] References Cited

U.S. PATENT DOCUMENTS

| | | | |
|---|---|---|---|
| 4,602,349 | 7/1986 | Blackley | 371/25 |
| 4,701,920 | 10/1987 | Resnick | 371/25 |
| 4,710,931 | 12/1987 | Bellay | 371/25 |
| 4,825,439 | 4/1989 | Sakashita | 371/25 |

*Primary Examiner*—Michael R. Fleming
*Attorney, Agent, or Firm*—Helfgott & Karas

[57] ABSTRACT

An IC logic circuit includes a combinational network of a plurality of logic circuits, a plurality of latches having a D-type flip-flop and a delay circuit, the output from the D-type flip-flop being directly applied to one of the logic circuits and indirectly derived through the delay circuit, a plurality of selectors disposed between two latches to selectively applying an output from the logic circuit or an output from the preceding stage latch to the succeeding stage latch, and a means for supplying clock signal to said D-type flip-flops, a delay time of the delay circuit being longer than a time period spending in the clock signal supplying means.

9 Claims, 2 Drawing Sheets

LOGIC CIRCUIT SYSTEM WITH LATCH CIRCUITS FOR RELIABLE SCAN-PATH TESTING

BACKGROUND OF THE INVENTION

1. Field of the Invention:

This invention relates to a logic IC, and more particularly to an improvement of latch circuits provided to the logic IC for a scan-path testing.

2. Description of the Related Art:

In recent years, logic IC's have been developed to have a high integration density with an increase in number of logic circuits integrated in a single IC chip. One problem of such highly integrated logic IC is in testing of manufactured products If the test is carried out by applying all possible input signals to input terminals of the IC to be tested and detecting output signals to compare with expected logic values, an enormous period of time is required. This method is, in fact, ineffective for logic IC's of very large scale integration.

For time saving, a scan-path testing has been proposed. For the scan-path testing, the logic IC is provided with a plurality of flip-flops which are coupled with the combinational network in the logic IC to form a shift-register for inputting test signals and outputting internal signals. The test and internal signals are shifted through the shift-register in response to clock pulses. Although the same clock pulse is supplied to all the flip-flops, it is not identically applied due to differences between circuit paths from a clock terminal to respective flip-flops. If the application of the clock to one flip-flop becomes later than generation of an output from the preceding stage flip-flop, the output of the preceding stage flip-flop is erroneously set in the flip-flop to cause a shifting of signal through two or more stages in response to one clock pulse. Under such situation, a normal shift-register operation is no longer expected.

The erroneous shifting may be prevented by achieving the identical application of the clock signal to all the flip-flops. Therefore, the circuit for applying the clock signal to the flip-flops must be designed to have little stray capacitance. It is difficult to design such clock signal applying circuit having little stray capacitance.

SUMMARY OF THE INVENTION

It is, therefore, a primary object of the present invention to provide an IC logic circuit having latch circuits for reliable scan-path testing.

It is another object to provide latch circuits in a logic IC to form a shift-register in which early setting of each stage is prevented.

The present invention provides a logic circuit comprising a combinational network, a plurality of latch circuits each having a data input terminal, a clock terminal, a data output terminal connected to the combinational network, a delayed output terminal, a flip-flop receiving an input data from the data input terminal and producing an output data at its data output end in response to a clock signal applied to the clock terminal, and a delay circuit inserted between the data output end of the flip-flop and delayed output terminals, the data output end of the flip-flop being connected to the data output terminal, a plurality of selectors each formed between two of the latch circuits and selecting one of the delayed output from one latch circuit and a signal from the combinational network as the input data to the other latch circuit, and a clock input terminal receiving the clock signal and supplying the same to the clock terminals of the latch circuits.

Another feature of the present invention is a shift-register comprising a plurality of latch circuits, each of the latch circuits having a data input terminal, a clock terminal, a data output terminal, a flip-flop receiving a data from the data input terminal and producing an output data in response to a clock signal applied to the clock terminal, and a delay circuit supplying the output data to the data output terminal after a predetermined time delay, a clock input terminal receiving the clock signal to supply to the clock terminals of the latch circuits, and means for coupling the latch circuits in a cascade connection by electrically connecting the data input terminals of the latch circuits with the data output terminal of preceding latch circuits.

In the logic circuit, if the selectors select the delayed output as the input data, the plurality of flip-flops form a shift-register. The shift-register in accordance with the invention is formed by using latch circuits including a delay circuit applying a time delay to an output from a flip-flop. In other words, latch circuits produce outputs after a predetermined time delay from a time when flip-flops produce the output. Therefore, if an application of a clock signal to a latch circuit of a later stage in the shift-register is delayed by a time duration shorter than the predetermined time, the latch circuit in the later stage is not affected by the output of the preceding stage latch circuit which is changed by the same clock signal. More specifically, an input data is not transferred through two stage latch circuits by a single clock signal. The allowance of the time delay in the circuit path for supplying the clock signal becomes large, resulting in an easy design of the clock signal supplying circuit.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
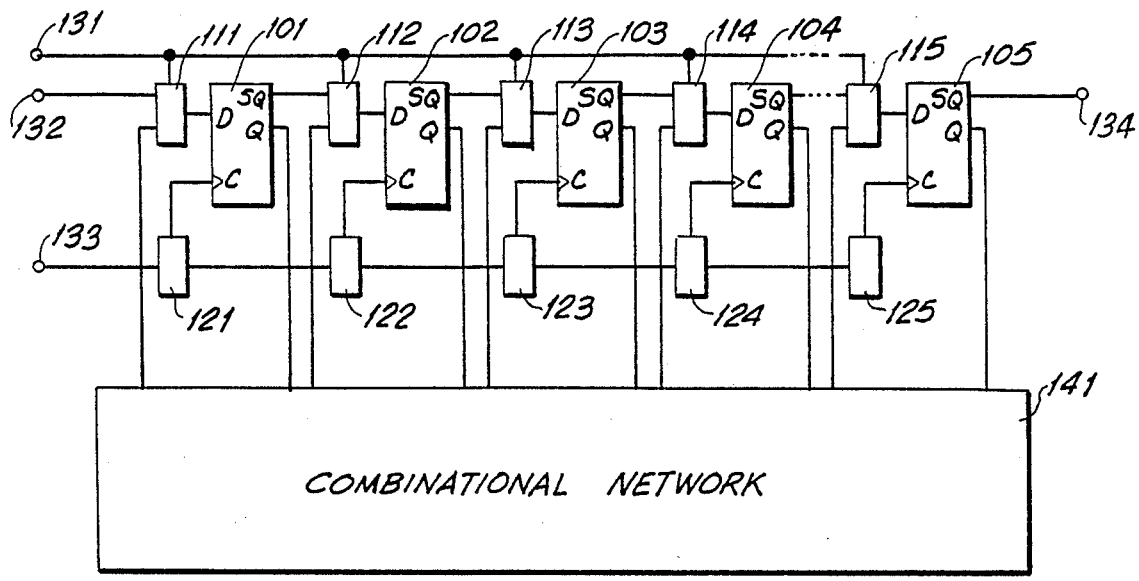
FIG. 1 is a block diagram showing a first preferred embodiment.

Referring to FIG. 1, an IC logic circuit of a first preferred embodiment of the present invention includes a combinational network 141, a plurality of latch circuits 101 to 105, a plurality of selectors 111 to 115 and a clock supplying circuit having a clock terminal 133 and clock drivers 121 to 125, all of which are formed on a single IC chip and wired as shown. The combinational network 141 has a plurality of logic circuit blocks which have a predetermined logic function by being connected through the latch circuits 101 to 105. The latch circuits 101 to 105 respectively have two functions. One function is the above-mentioned signal transmission between circuit blocks in the combinational network 141. This function is performed at a normal logic operation. The other function is a shift-register which is used at testing of the combinational network 141. Those two functions are switched over by the selectors 111 to 115 which are controlled by a scan mode control signal applied to a scan mode control terminal 131. If the selectors 111 to 115 select signals from the combinational network 141, the latch circuits 101 to 105 operate as the signal transmitter. In the other case where the selectors 111 to 115 select signals from the scan-in terminal 132 and from the preceding latch circuits 101 to 104, the latch circuits 101 to 105 operate as the shift-register. The latch circuits 101 to 105 receive the signal from the selectors 111 to 115 in response to clock signal which is externally applied to the clock terminal 133 and then supplied to the latch circuits 101 to 105 through the clock drivers 121 to 125. In the test mode, test data is inputted from the scan-in terminal 132 to the latch circuits 101 to 105 by using their shift-register function and then supplied to circuit blocks in the combinational network 141 from the latch circuits 101 to 105. After the circuit blocks in the combinational network 141 is operated by using the applied test data, output data from the respective circuit blocks are set in the latch circuits 101 to 105. The set data in the latch circuits 101 to 105 is derived from the scan-out terminal 134 by using the shift-register function to check whether the output data are same as expected data.

Figure 2A:
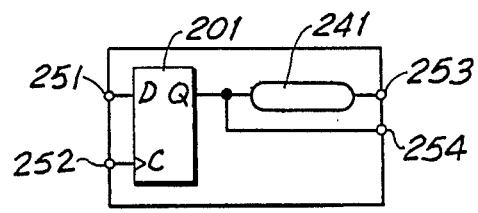
FIG. 2(a) is a block diagram of a latch circuit used in the first preferred embodiment shown in FIG. 1, FIGS. 2(b) and 2(c) being circuit diagrams of a D-type flip-flop and a delay circuit used in the latch circuit shown in FIG. 2(a)

The latch circuits 101 to 105 are respectively made of a D-type flip-flop 201 and a delay circuit 241 as shown in FIG. 2(a). The D-type flip-flop 201 has a data inpput D connected to a data terminal 251, a clock input C connected to a clock terminal 252 and a data output Q connected to a data output terminal 254 and the delay circuit 241. A output end (SQ) of the delay circuit 241 is connected to a delayed data output terminal 253. The data output terminal 254 is connected to the circuit block in the combinational network 141, while the delayed data output terminal 253 is connected to the input terminal of the selectors 111 to 115.

Figure 2B:
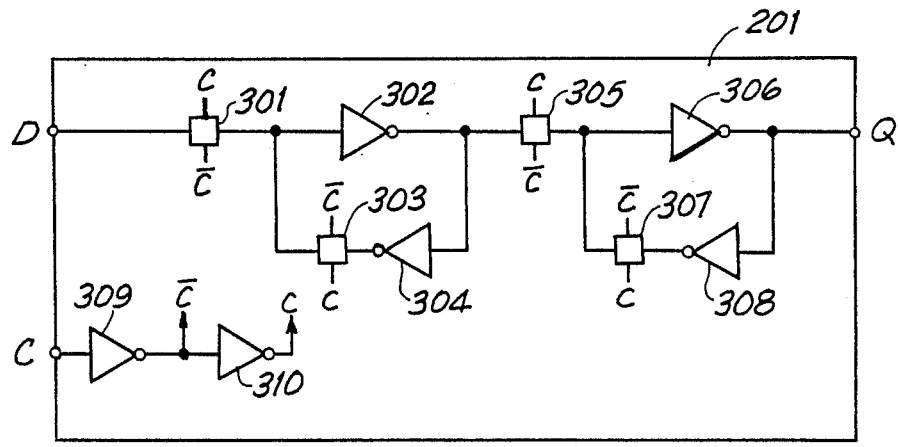
Figure 2C:
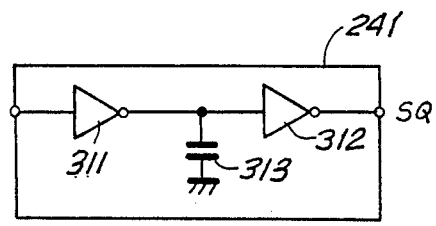

One example of the D-type flip-flop 201 and the delay circuit 241 are shown in FIGS. 2(b) and 2(c). The D-type flip-flop 201 is constituted of transfer gates 301, 303, 305 and 307 and inverters 302, 304, 306 and 308 all of which are formed of CMOS FET's of N- and P-channel MOS field effect transistors. In the inverters 302, 304, 306 and 308, the N- and P-channel MOS field effect transistors are connected in series between two power supply lines. The N- and P-channel MOS field effect transistors are connected in parallel between input end and output end of the transfer gates 301, 303, 305 and 307. The clock signal applied to the clock input C is applied to CMOS inverters 309 and 310 to generate complementary clocks c and c̄ which are applied to the transfer gates 301, 303, 305 and 307.

One example of the delay circuit 241 is shown in FIG. 2(c). A capacitor 313 is connected to a circuit path between CMOS inverters 311 and 312 and is formed of a P-N junction capacitance. One example of the capacitance of the capacitor 313 is 5 to 10 pF by which a delay time of 5 to 10 nano-seconds is obtained. The capacitance should be selected to obtain a time delay of 5 to 25 nano-seconds.

Figure 3:
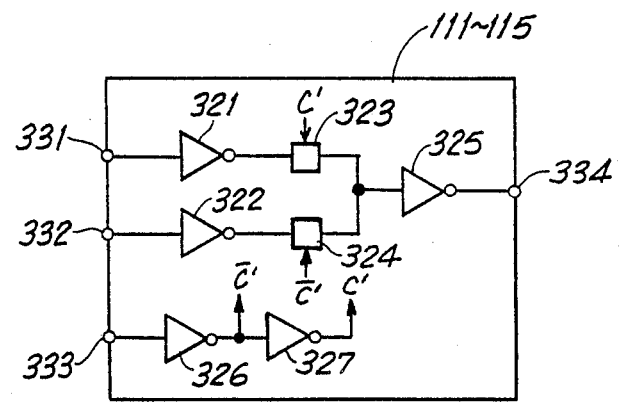
FIG. 3 is a circuit diagram of the selector used in the first preferred embodiment shown in FIG. 1.

An example of the selectors 111 to 115 is shown in FIG. 3. The scan-mode control signal is applied to the control terminal 333 and to CMOS inverters 326 and 327 to generate complementary control signals c' and c̄'. The signal applied to a first input terminal 331 is supplied to a CMOS inverter 325 through a CMOS inverter 321 and a transfer gate 323. Another signal applied to a second input terminal 332 is also supplied to the CMOS inverter 325 through a CMOS inverter 322 and a transfer gate 324. The output of the inverter 325 is derived from the output terminal 334. The transfer gate 323 is formed of one of N- and P-channel MOS field effect transistors and controlled by the control signal c'. The transfer gate 324 is formed of the other one of the N- and P-channel MOS field effect transistors and controlled by the control signal c̄'.

In the latch circuit 101 to 105 in the first preferred embodiment, the output Q obtained in accordance with an input data which is received at the data input D in response to a clock signal is derived from the data output Q without time delay and is supplied to the combinational network, but is derived from the delayed data output SQ after a time delay determined by the delay circuit 241. This time delay at the delayed data output SQ momentarily prevents the next stage flip-flop from receiving the output of the preceding stage. This means that, if the application of clock signal to the next stage flip-flop is delayed from it to the preceding stage flip-flop, the data shift is limited to one stage in the shift-register. Thus, allowance of the time delay of clock signal application becomes large to make the design of clock supplying circuit easy.

Figure 4:
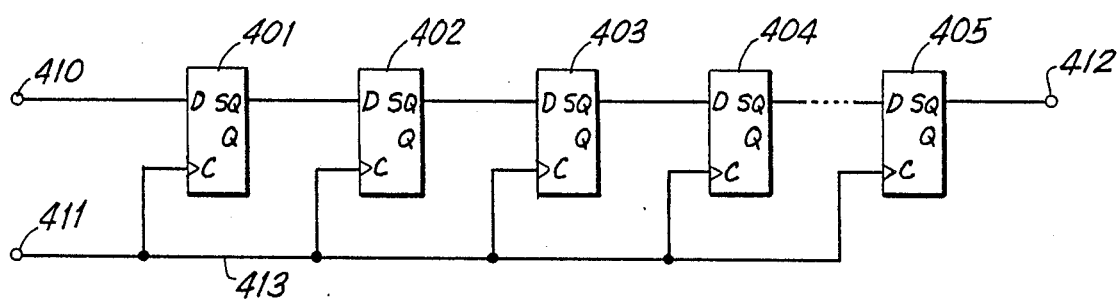
FIG. 4 is a block diagram showing a second preferred embodiment of the present invention.

FIG. 4 shows a shift-register as a second preferred embodiment of the present invention. A plurality of latch circuits 401 to 405 are cascaded by connecting a delayed data output SQ of preceding latch circuit to a data input of succeeding latch circuit. Each of the latch circuits 401 to 405 has a D-type flip-flop 201 and a delay circuit 241 as explained with reference to FIGS. 2(a) to 2(c). A clock signal is applied to a clock input terminal 411 and then supplied to clock terminals C of the latch circuits 401 to 405 through a wiring layer 413.

In response to an application of one clock signal, an input data applied to a data input terminal 410 is set in the first stage latch circuit 401. In the latch circuit 401, an output data is produced by the D-type flip-flop 201 and derived at the data output Q without intentional time delay, but is derived from the delayed data output SQ after a time delay predetermined by the delay circuit 241. The output data at the delayed data output SQ of the first stage latch circuit 401 is set in the second stage latch circuit 402 in response to the following one clock signal. In this manner, the input data shifted through the cascaded latch circuits 401 to 405 in response to application of clock signal.

The wiring layer 413 for supplying the clock signal to the latch circuits 401 to 405 has some stray capacitance causing a time delay. Therefore, an application of clock signal to the latch circuit located far from the clock input terminal 411 is delayed from the latch circuit located near the clock input terminal 411. If the output data of the D-type flip-flop 201 is directly applied to the next stage flip-flop, an input data may errorneously be transferred through two stages in response to an application of one clock signal. More specifically, when the clock signal is applied to the later stage latch circuit after the preceding stage latch circuit changes its output in response to the same clock signal, the changed output of the preceding stage flip-flop is set in the later stage flip-flop to cause the above-mentioned errorneous transfer.

This errorneous transfer is prevented by the delay circuit 241. The delay time of the delay circuit 241 is selected longer than the time delay in the wiring layer 413. By this arrangement, if the application of clock signal is delayed, the output at the delayed data output SQ is not changed at the clock signal application but is changed after the clock signal application. Therefore, the input data is not shifted through two stages of flip-flop circuit by one clock signal application. In a large part of logic IC's, it is sufficient to select the time delay of the delay circuit 241 at 5 to 25 nano-seconds.

Although some specific embodiments were explained hereinbefore, it is apparent that the present invention should not be limited to the embodiments. The D-type flip-flops in the latch circuit may be replaced with other type of flip-flops which is controllable by a clock signal. The delay circuit can be also replaced with other types such as a circuit using MOS capacitor or a series circuit of inverters or other logic circuits which uses signal delays in the inverters or the logic circuits without using additional capacitor element.

What is claimed is:

1. A logic circuit system comprising:
   a plurality of logic circuits;
   a plurality of latch circuits each having an input terminal, a first output terminal, a second output terminal and a clock terminal and including a flip-flop and a delay circuit, said flip-flop having a data input node connected to said input terminal, a data output node connected to said first output terminal and a clock input node connected to said clock terminal, said delay circuit having an input node connected between said data output node of said flip-flop and said second output terminal, said first output terminal being further connected to one of said logic circuits to apply a signal at said first output terminal to said one logic circuit;
   a plurality of selectors having a first selector input terminal connected to said second output terminal, a second selector input terminal connected to a different one of said logic circuits to receive a signal from said different one logic circuit, a selector output terminal connected to said input terminal, and a control signal terminal;
   a control means for producing a control signal to be applied to said control signal terminal to selectively connect said selector output terminal to one of said first and second selector input terminals, said plurality of latch circuits being connected to form a shift-register when said selector output terminal is connected to said first selector input terminal and being connected to form a logic circuit with said plurality of logic circuits when said selector output terminal is connected to said second selector input terminal; and
   means for applying a clock signal to said clock input node to operate the flip-flops of said latch circuits.

2. A logic circuit system as claimed in claim 1, wherein said flip-flop is D-type flip-flop.

3. A logic circuit system as claimed in claim 2, wherein said delay circuit has a delay time of 5 to 25 nano-seconds.

4. A logic circuit system as claimed in claim 3, wherein said delay circuit has a cascade connection of two inverters and a capacitor having a capacitance of 5 to 10 pF, said capacitor being inserted between an interconnection path of said two inverters and a fixed potential point.

5. A logic circuit system as claimed in claim 1, further comprising a scan-in terminal receiving test data to be applied to said logic circuit through said shift-register, and a scan-out terminal deriving output signals of said logic circuit through said shift-register.

6. A shift-register comprising: a plurality of latches connected to form a cascade connection, each of said latches having a data input terminal, a clock terminal and a data output terminal and including a flip-flop having a data input node connected to said data input terminal to receive an input data from a preceding stage latch, a data output node and a clock input node, and a delay circuit having an input node connected to said data output node and an output node connected to said data output terminal which is connected to said data input terminal in a succeeding stage latch;
   an input terminal receiving said input data to apply it to said data input terminal of a first stage latch;
   an output terminal connected to said data output terminal in a final stage latch; and
   means for supplying a clock signal to the clock terminals of said latches to operate the flip-flops thereof.

7. A shift-register as claimed in claim 6, wherein said delay circuit has a first delay time for transmitting a signal from said input node to said output node, said clock signal supplying means having a signal path having a second delay time for transmitting said clock signal therethrough, said first delay time being longer than said second delay time.

8. A shift-register as claimed in claim 7, wherein said first delay time is 5 to 25 nano-seconds.

9. A shift-register as claimed in claim 8, wherein said delay circuit has two inverters connected to form a cascade connection and a capacitor having a capacitance of 5 to 10 pF, said capacitor being connected between an interconnecting portion of said two inverters and a reference potential point.

* * * * *